(12) United States Patent
Yoon

(10) Patent No.: US 6,448,626 B1
(45) Date of Patent: Sep. 10, 2002

(54) SEMICONDUCTOR MEMORY DEVICE HAVING A PLURALITY OF LASER FUSES

(75) Inventor: Hong-il Yoon, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/672,924

(22) Filed: Sep. 28, 2000

(30) Foreign Application Priority Data

Sep. 30, 1999 (KR) .............................................. 99-42035

(51) Int. Cl.⁷ .......................... H01L 29/00; H01L 27/10; H01L 27/148; G11C 17/00
(52) U.S. Cl. ..................... 257/529; 257/209; 257/225.7; 365/96
(58) Field of Search ................................. 257/529, 530, 257/665; 438/132, 131, 215, 281, 333, 467, 601, 600, 957; 365/96, 225.7

(56) References Cited

U.S. PATENT DOCUMENTS 5,747,869 A 5/1998 Prall et al. .................. 257/529
6,172,896 B1 * 1/2001 Iee ............................... 365/96

* cited by examiner

*Primary Examiner*—Olik Chaudhuri
*Assistant Examiner*—(Vikki) Hoa B. Trinh
(74) *Attorney, Agent, or Firm*—Mills & Onello, LLP

(57) ABSTRACT

A semiconductor memory device having a plurality of laser fuses is provided. In the semiconductor memory device, the plurality of laser fuses include a first region including the ends of one side of the plurality of laser fuses, a second region including the ends of the other side of the plurality of laser fuses, and a fusing region in which the plurality of laser fuses are fused. Since the laser fuses included in the fusing region are inclined so as to have a predetermined angle with the parts thereof included in the first and the second regions, the overall area and width of the fusing region are reduced.

6 Claims, 4 Drawing Sheets

SEMICONDUCTOR MEMORY DEVICE HAVING A PLURALITY OF LASER FUSES

BACKGROUND OF THE INVENTION

1. Field of the Invention

The present invention relates to a semiconductor memory device, and more particularly, to a semiconductor memory device having a plurality of laser fuses.

2. Description of the Related Art

When a semiconductor memory device is fabricated, several parameters of the memory device are tested to determine whether it performs according to predetermined design constraints. If any one of the testing parameters is outside tolerance, this is taken as an indication that the device is defective. Consequently, the semiconductor memory device is discarded.

However, in the course of testing the operation of a semiconductor memory device including a plurality of primary memory cells for data storage, if some of the memory cells prove to be defective, the defective primary memory cells in question can be replaced by redundant memory cells fabricated on the device. This redundant configuration permits the semiconductor memory device to continue to operate in a normal state, even though some of the primary cells may be defective. The primary memory cells and redundant memory cells are all connected via fuses controlled by control circuits in the semiconductor memory device. As stated above, if a defective memory cell is discovered in a semiconductor memory device, then a fuse coupled to the defective memory cell is blown and the redundant memory cell is connected instead. Accordingly, the semiconductor memory device with defective primary cells can operate normally and is not discarded.

Highly integrated semiconductor memory devices have a fairly high manufacturing cost, which causes a large loss if any defective cells are discovered. This is why the memory devices include redundant memory cells with which to replace defective primary memory cells. Types of fuses deployed in such semiconductor memory devices include electrical fuses selectively cut by flow of excessive current, or "overcurrent", and laser fuses selectively cut by applied laser beam. In contemporary systems, laser fuses are widely used due to their simplicity in use and layout. Electrical fuses are commonly used in semiconductor memory devices such as Electrically Erasable Programmable Read Only Memory (EEPROM) while the laser fuses are very often used in Dynamic Random Access Memory (DRAM).

FIG. 1 is a block diagram of a laser fuse box in a conventional semiconductor memory device 101. In the device, laser fuses 111–114 formed on the device each have a predetermined width D and are separated from each other by a predetermined space E1. The laser fuses 111–114 include a fusing region 121 where fusing by a laser beam occurs. The laser fuses 111–114 are laid out at a right angle to the direction of the length L1 of the fusing region 121.

As shown in FIG. 1, there is a limit to the degree at which the size of the fusing region 121 can be reduced, since the primary axes of the laser fuses 111–114 are at right angles with respect to the direction of the length L1 of the fusing region 121. Such a limit restricts the reduction in the overall size of the semiconductor memory device 101. In order to reduce the size of the fusing region 121 in this configuration, the laser spot size needs to be smaller, which is not a simple task to achieve. Therefore, any reduction in the size of the semiconductor memory device 101 requires that the area of the fusing region 121 be reduced.

Furthermore, U.S. Pat. No. 5,747,869 shows laser fuses having narrow ends and wide ends, of which the wide ends are portions to be fused. Since the wide ends are required to have a predetermined length for achieving a fusing operation, the laser fuses become longer, and accordingly, the area of the fusing region is not decreased.

SUMMARY OF THE INVENTION

To address the above limitations, it is an objective of the present invention to provide a semiconductor memory device including a plurality of laser fuses in which the width of a fusing region can be reduced.

Accordingly, to achieve the above objective, there is provided a semiconductor memory device having a plurality of laser fuses in which the plurality of laser fuses include a first region including the ends of one side of the plurality of laser fuses, a second region including the ends of the other side of the plurality of laser fuses, and a fusing region in which the laser fuses are fused, wherein the laser fuses of the fusing region are inclined so as to have a predetermined angle with respect to the first and second regions.

In the above semiconductor memory device, it is preferable that the space between the included portion of the laser fuses in the fusing region is narrower than those of the first and second regions, in which the laser fuses are formed of polysilicon or metal.

Furthermore, it is preferable that the laser fuses in the above fusing region are parallel to each other, and that the laser fuses in the first region are arranged parallel to those in the second region.

In another embodiment, the present invention is directed to a laser fuse for a semiconductor device. The laser fuse comprises first and second terminals formed on a semiconductor device, each terminal having a primary axis. A fuse region is formed on the semiconductor device coupled between the first and second terminals, the fuse region having a primary axis positioned at an angle relative to the primary axes of the first and second terminals.

In a preferred embodiment, the primary axes of the first and second terminals are parallel. The semiconductor device preferably comprises a memory device. The angle is preferably acute.

According to the present invention, the width, and thus the overall area, of the fusing region of the laser fuses can be reduced.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE PREFERRED EMBODIMENTS

Figure 1:
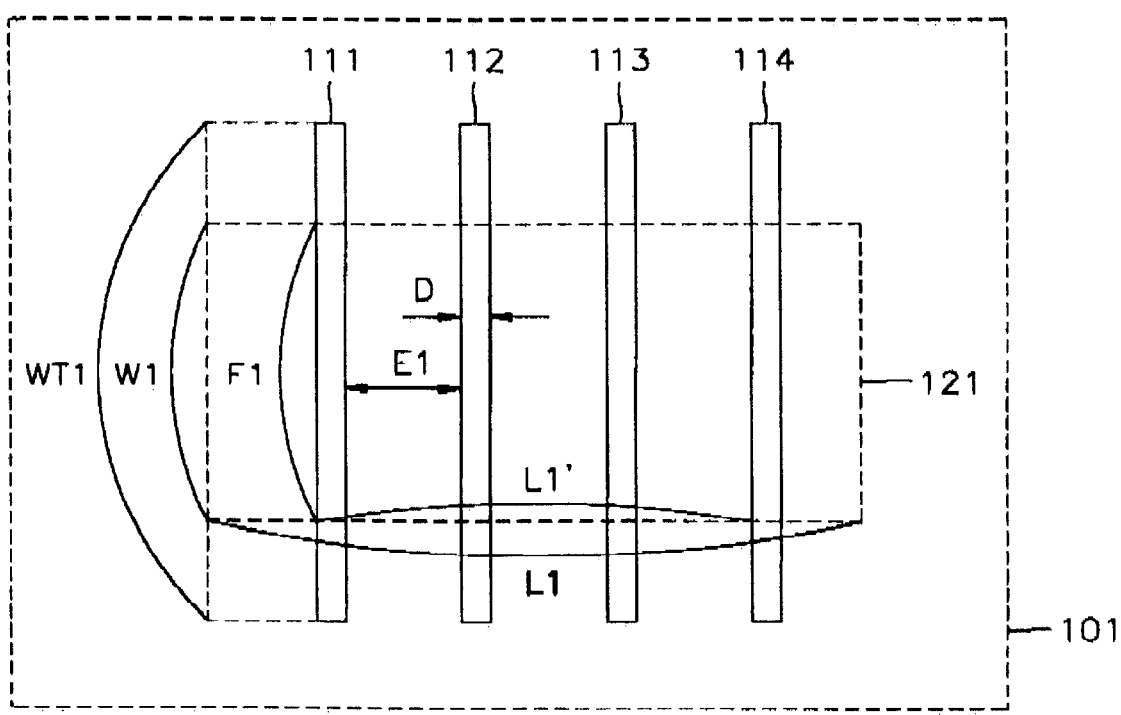
FIG. 1 is a diagram of a laser fuse box in a conventional semiconductor memory device.

The present invention now will be described more fully with reference to the accompanying drawings, in which preferred embodiments of the invention are shown. The same reference numerals in different drawings represent the same elements.

Figure 2:
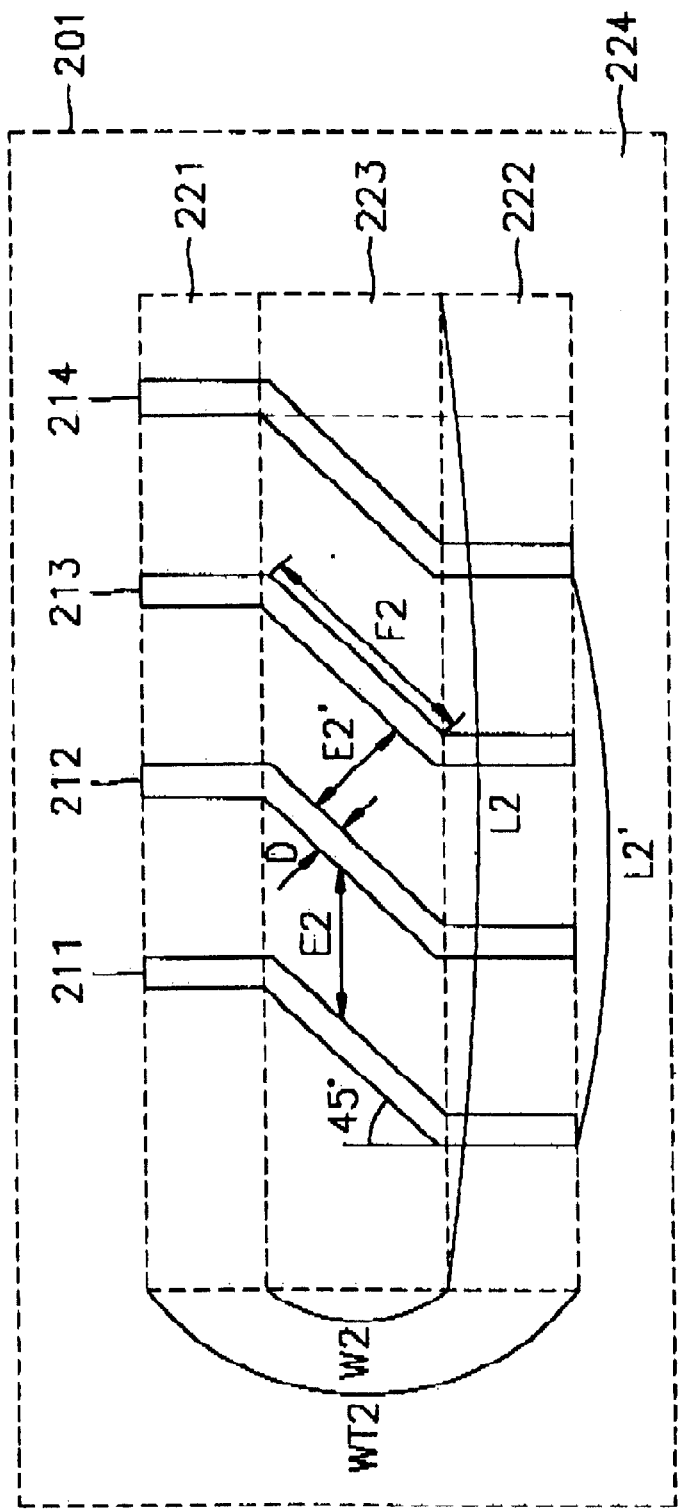
FIG. 2 is a diagram of a laser fuse box in a semiconductor memory device according to a first embodiment of the present invention.

FIG. 2 is a diagram of a laser fuse box in a semiconductor memory device according to a first embodiment of the present invention. The semiconductor memory device 201 of the first embodiment includes laser fuses 211–214, which are defined to include a first region 221, a second region 222, a fusing region 223, and a peripheral region 224.

Figure 3:
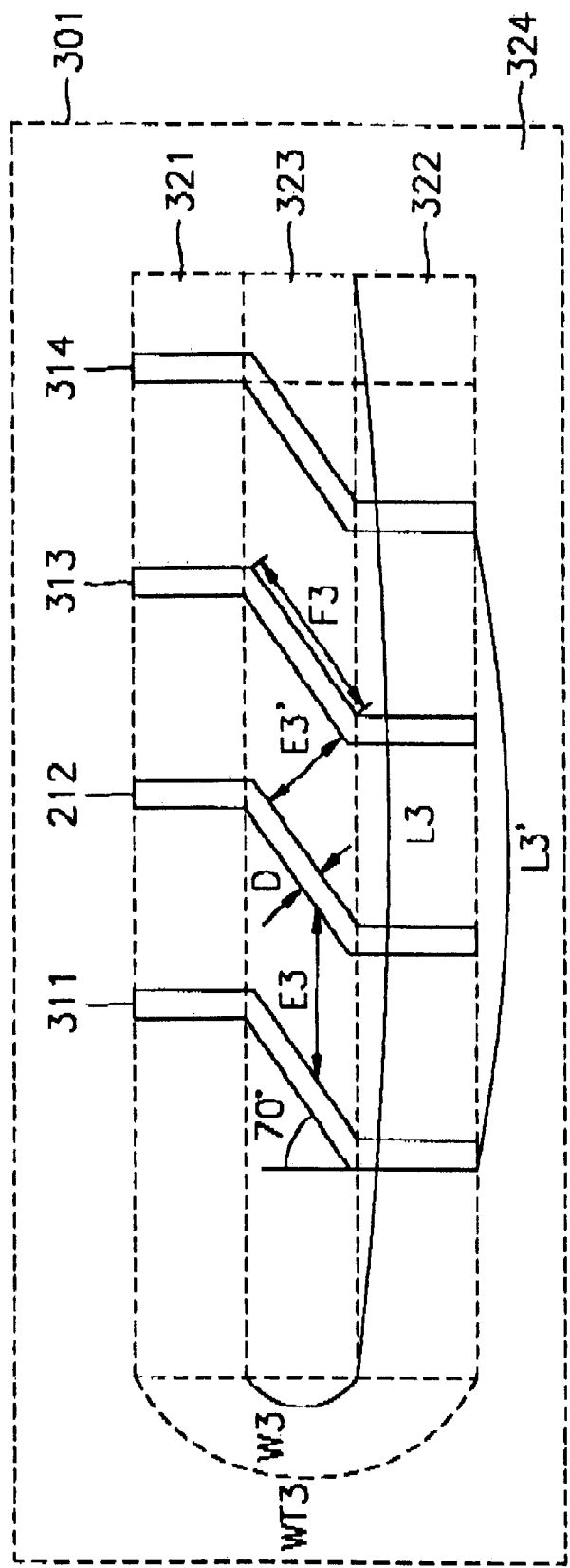
FIG. 3 is a diagram of a laser fuse box in a semiconductor memory device according to a second embodiment of the present invention.

FIG. 3 is a diagram of a laser fuse box in a semiconductor memory device according to a second embodiment of the present invention. The semiconductor memory device 301 of the second embodiment includes laser fuses 311–314 which are defined to include a first region 321, a second region 322, a fusing region 323, and a peripheral region 324.

In the first and second embodiments, the first regions 221 and 321 include the ends, or terminals, of one side of the laser fuses 211–214 and 311–314, and the second regions 222 and 322 include the ends, or terminals, of the other side of the laser fuses 211–214 and 311–314. The fusing regions 223 and 323 include the laser fuses 211–214 and 311–314 to be fused by a laser beam. In FIG. 2, the primary axes of the laser Ail fuses 211–214 in the fusing region 223 are provided at an angle of 45 degrees with respect to the primary axes of the portions in the first and second regions 221 and 222. In FIG. 3, the laser fuses 311–314 in the fusing region 323 are provided at an angle of 70 degrees with respect to the portions in the first and second regions 321 and 322.

As shown in FIGS. 2 and 3, given that the laser fuses 211–214 and 311–314 in to the fusing regions 223 and 323 are provided at a predetermined angle with respect to the portions in the first regions 221 and 321 and the second regions 222 and 322, and, at the same time, the fusing regions 223 and 323 are positioned in the center of the laser fuses 211–214 and 311–314, the widths WT2 and WT3 of the fusing regions are reduced, and accordingly, so are the areas of the fusing regions. Specifically, assuming the condition that the lengths F1, F2 and F3 of the fuses within the fusing regions shown in FIGS. 1 through 3 are equal to one another and assuming the spaces E1, E2', and E3' between adjacent fuses have the same values, i.e., F1=F2=F3 and E1=E2'=E3', then the area X1 of the fusing region 121 of FIG. 1 and the areas X2 and X3 of the fusing regions 223 and 323 of FIGS. 2 and 3 are given by the following mathematical formulae. (For clearer comparison among the areas X1, X2 and X3, it is assumed that the fuse length F1 and the length L1 of the fusing region 121 in FIG. 1 are 7 µm and 200 µm, respectively.)

$$X1 = W1 \times L1 \quad (1)$$
$$= F1 \times L1$$
$$= 7\ \mu m \times 200\ \mu m$$
$$= 1400\ \mu m^2$$

$$X2 = W2 \times L2 \quad (2)$$
$$= F2\cos\theta \times (L1 + F2\sin\theta)$$
$$= 7\cos 45° \times (200 + 7\sin 45°)$$
$$= 1014\ \mu m^2$$

$$X3 = W3 \times L3 \quad (3)$$
$$= F3\cos\theta \times (L1 + F3\sin\theta)$$
$$= 7\cos 70° \times (200 + 7\sin 70°)$$
$$= 495\ \mu m^2$$

As indicated in the mathematical formulae (1) through (3), the area X1 of the fusing region 121 shown in FIG. 1 is 1400 µm² while the areas X2 and X3 of the fusing regions 223 and 323 shown in FIGS. 2 and 3 are reduced to 1014 µm² and 495 µm², respectively. This demonstrates that the resulting areas X2 and X3 of the fusing regions 223 and 323 for the configuration of the present invention are significantly reduced as compared to that of the fusing region 121 of the conventional configuration. This is due to the fact that portions of the laser fuses 211–214 and 311–314 included in the fusing regions 223 and 323 of the configuration of the present invention are provided at a predetermined angle with respect to parts thereof included in the first and the second regions 221 and 222.

Areas X1' and X2' included in the fusing regions 121 and 223 shown in FIGS. 1 and 2 are given by the following mathematical formulae:

$$X1' = W1 \times L1' \quad (4)$$
$$= F1 \times L1'$$
$$= F1\{(N-1)(D+E1)\}$$

$$X2' = W2 \times L2' \quad (5)$$
$$= F2\cos\theta \times \left\{(N-1)\left(D + \frac{E2'}{\cos\theta}\right) + \frac{E2'}{\cos\theta}\right\}$$

where N is the number of fuses in the fusing regions 121 and 223, and θ is the acute angle between the portions of the fuse in the fusing region 223 and the second region 222.

In order for the area X2' to be less than the area X1', i.e., X2' ⟨ X1' by comparing the mathematical formulae (4) and (5), the following mathematical formula (6) is established:

$$F2\cos\theta \times \left\{(N-1)\left(D + \frac{E2'}{\cos\theta}\right) + \frac{E2'}{\cos\theta}\right\} < F1\{(N-1)(D+E1)\} \quad (6)$$

$$-\cos\theta \times \left\{\left(D + \frac{E2'}{\cos\theta}\right) + \left(\frac{E2'}{\cos\theta}\right)\left(\frac{1}{N-1}\right)\right\} < (D+E1)$$

$$-\left(D\cos\theta + E2' + \frac{E2'}{N-1}\right) < (D+E1)$$

$$-\left(D\cos\theta + \frac{E2'}{N-1}\right) < D$$

where the last inequality is obtained by assuming that F1 is equal to F2 (F1 =F2) and E1 is equal to E2' (E1=E2'); and according to the mathematical formula (6), as the pitch angle θ of the fusing portion of the fuses increase, the area X2' becomes less than the area X1'.

The laser fuses 211–214 and 311–314 included in the fusing regions 223 and 323 10 are provided at a predetermined angle with the parts thereof included in the first and second regions 221, 321, 222, and 322. As a result, the widths W2 and W3 of the fusing regions 223 and 323 decrease; however, the corresponding lengths L2 and L3 of the same regions increase. However, assuming the e same design rule is applied for the semiconductor memory devices 201 and 301, the lengths L2 and L3 of the fusing regions 223 and 323 may be allowed some increase to achieve a decrease in overall area of the fuse regions. Therefore, reduction of the widths W2 and W3 of the fusing regions 223 and 323 results in a more efficient use of circuit area of the semiconductor memory devices 201 and 301.

The width D and the spaces E2 and E3 between the laser fuses 211–214 and 311–314 in the horizontal direction are determined by the laser spot size of a laser beam. That is, as the laser spot size becomes smaller, the width D and the spaces E2 and E3 between laser fuses 211–214 and 311–314 in the horizontal direction can be reduced accordingly. The width D and the spaces E2 and E3 between the laser fuses 211–214 and 311–314 in the horizontal direction are designed to be as small as possible, while precluding the possibility of damage to adjacent laser fuses at the time of fusing.

The laser fuses 211–214 and 311–314 are preferably formed of polysilicon or metal. The first regions 221 and 321, the second regions 222 and 322, and the peripheral regions 224 and 324 are preferably covered with an insulator film such as an oxide or nitride film, while the fusing regions 223 and 323 are preferably not covered with the insulator film so that the laser fuses 211–214 and 311–314 included therein can be readily cut by the laser beam. Furthermore, the peripheral regions 224 and 324, the first regions 221 and 321, the second regions 222 and 322, and the fusing regions 223 and 323 are preferably coated with a passivation layer such as polyimide so as to isolate the internal elements in the semiconductor memory devices 201 and 301 and the laser fuses 211–214 and 311–314 from external atmosphere. In FIGS. 2 and 3, only four laser fuses 211–214 and 311–314 are shown, but the semiconductor memory devices may include a plurality of laser fuses of various numbers, depending on the application.

Figure 4:
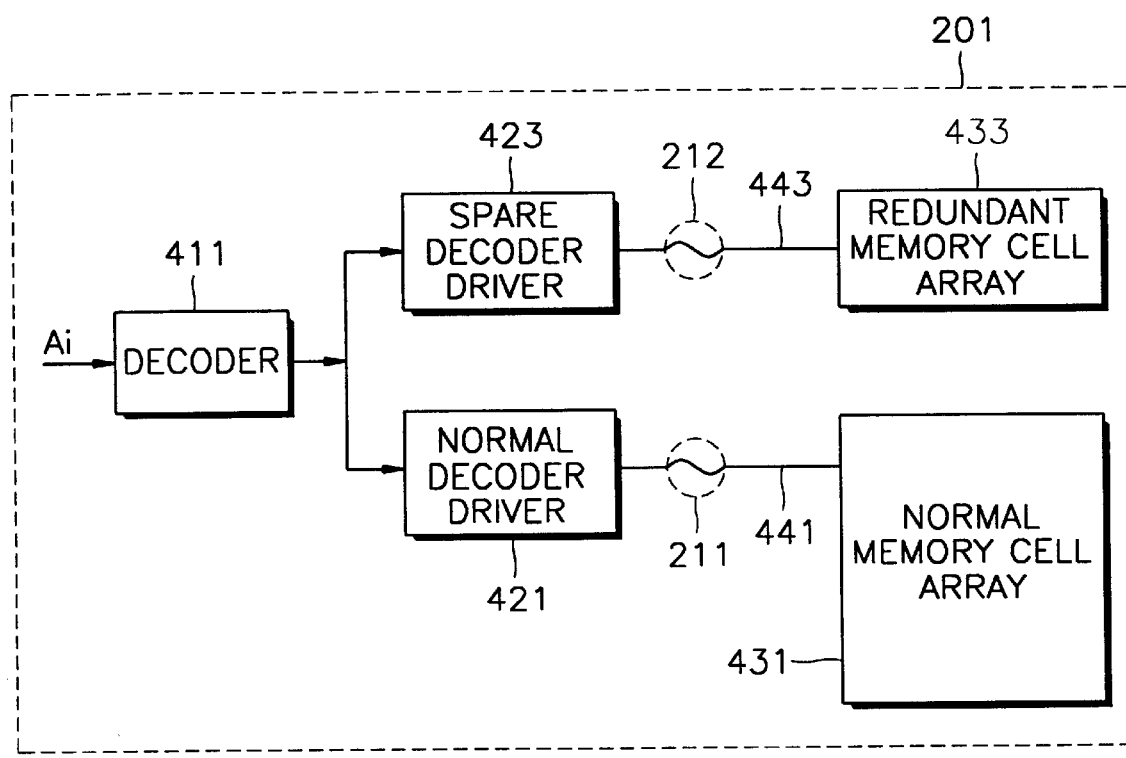
FIG. 4 is a block diagram of a component of a semiconductor memory device to utilizing a laser fuse box according to the first embodiment of the present invention.

FIG. 4 is a block diagram of a part of the semiconductor memory device 201 according to the first embodiment of the present invention. Referring to FIG. 4, the semiconductor memory device 201 includes a decoder 411, a primary (normal) decoder driver 421, a primary (normal) memory cell array 431, a spare decoder driver 423, and a redundant memory cell array 433. In the memory device 201, the normal decoder driver 421 is connected to the normal memory cell array 431 through a first laser fuse 211 and a first word line 441, while the spare decoder driver 423 is connected to the redundant memory cell array 433 through a second laser fuse 212 and a second word line 443. When fabrication is completed, the semiconductor memory device 201 is tested to ensure that the device operates correctly. In the course of such testing, if all the normal memory cells coupled to the first word line 441 operate correctly, the second laser fuse 212 is cut and then external data is stored in the normal memory cell array 431. Conversely, if some of the normal memory cells coupled to the first word line do not operate correctly, the first laser fuse 211 is cut. Therefore, in the event that the first word line 441 is selected by an external address Ai, the decoder 411 activates the second word line 443 through the spare decoder driver 423, and thus data which would otherwise be stored in the memory cells coupled to the first word line 441 is stored in the memory cells coupled to the second word line 443.

Although FIG. 4 outlines the operation of the semiconductor memory device 201 using the two word lines 441 and 443 for convenience of explanation, the semiconductor memory device 201 preferably includes a plurality of word lines to accordingly have a plurality of laser fuses. Furthermore, the plurality of laser fuses are also applicable to many other kinds of circuits in the semiconductor memory device 201 beyond memory cells.

As described in the foregoing, according to the present invention, the overall size of the semiconductor memory devices 201 and 301 including a plurality of the laser fuses 211–214 and 311–314 can be reduced since the areas X2 and X3 and the widths WT2 and WT3 of the laser fuses 211–214 and 311–314 are reduced. Additionally, the possibility of adjacent laser fuses being damaged at the time of fusing becomes even lower with an increase in the spaces E2' and E3' between the laser fuses 211–214 and 311–314 included in the fusing regions 223 and 323. With these features, the reliability and production throughput of the semiconductor memory devices 201 and 301 can be enhanced.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A semiconductor memory device comprising a plurality of laser fuses,
   wherein the plurality of laser fuses include a first region including the ends of one side of the plurality of laser fuses, a second region including the ends of the other side of the plurality of laser fuses, and a fusing region between the first region and the second region in which the plurality of laser fuses are fused, and
   wherein the laser fuses in the fusing region are formed at an incline with respect to the ends in the first and second regions so as to have a predetermined angle with respect to the ends of the laser fuses included in the first and the second regions.

2. The semiconductor memory device of claim 1, wherein the space between the parts of the laser fuses included in the fusing region is narrower than the space between the parts of the laser fuses included in the first and second regions.

3. The semiconductor memory device of claim 1, wherein the laser fuses included in the fusing region run parallel to one another.

4. The semiconductor memory device of claim 1, wherein the parts of the laser fuses included in the first region are parallel to the parts of the laser fuses included in the second region.

5. The semiconductor memory device of claim 1, wherein the laser fuses are formed of a material selected from the group of materials consisting of polysilicon and metal.

6. The semiconductor memory device of claim 1, wherein the laser fuses are employed to substitute redundant memory cells for defective normal memory cells in the event of some of the normal memory cells being defective.

* * * * *